(12) United States Patent
Yun et al.

(10) Patent No.: US 12,044,974 B2
(45) Date of Patent: Jul. 23, 2024

(54) COMPOSITIONS FOR REMOVING PHOTORESISTS AND METHODS OF MANUFACTURING SEMICONDUCTOR DEVICES AND SEMICONDUCTOR PACKAGES USING THE COMPOSITIONS

(71) Applicant: Samsung Electronics Co., Ltd., Suwon-si (KR)

(72) Inventors: Hyojin Yun, Suwon-si (KR); Seungwon Kim, Hwaseong-si (KR); Taeyoung Kim, Yongin-si (KR); Woojung Park, Hwaseong-si (KR); Jinhye Bae, Suwon-si (KR); Hyunseop Shin, Yongin-si (KR); Mintae Lee, Yongin-si (KR); Hoon Han, Anyang-si (KR); Moonyoung Kim, Seoul (KR); Moonchang Kim, Yongin-si (KR); Cheolmo Yang, Yongin-si (KR); Yunseok Choi, Yongin-si (KR)

(73) Assignees: SAMSUNG ELECTRONICS CO., LTD., Suwon-si (KR); KPX CHEMICAL CO., LTD, Seoul (KR)

( * ) Notice: Subject to any disclaimer, the term of this patent is extended or adjusted under 35 U.S.C. 154(b) by 21 days.

(21) Appl. No.: 17/569,556

(22) Filed: Jan. 6, 2022

(65) Prior Publication Data

US 2022/0350253 A1 Nov. 3, 2022

(30) Foreign Application Priority Data

May 3, 2021 (KR) .................. 10-2021-0057482

(51) Int. Cl.
*G03F 7/42* (2006.01)
*B08B 3/04* (2006.01)
(Continued)

(52) U.S. Cl.
CPC ............. *G03F 7/425* (2013.01); *B08B 3/04* (2013.01); *C11D 3/044* (2013.01); *H01L 21/0206* (2013.01)

(58) Field of Classification Search
CPC .......... G03F 7/425; G03F 7/0382; G03F 7/20; G03F 7/26; G03F 7/34; B08B 3/04;
(Continued)

(56) References Cited

U.S. PATENT DOCUMENTS 7,767,636 B2 * 8/2010 Hsu .................. C11D 7/22
510/175
8,231,733 B2 * 7/2012 Egbe .................. C11D 3/3418
134/41
(Continued)

FOREIGN PATENT DOCUMENTS

CN 101833251 B * 11/2013 ............ G03F 7/423
CN 107815353 A * 3/2018 ............ C11D 1/008
(Continued)

OTHER PUBLICATIONS

Nishijima, WO-2017065153-A1, Machine Translation. (Year: 2023).*
Xu, CN-101833251-B, Machine Translation. (Year: 2023).*
Wang et al., CN-107815353-A, Machine Translation. (Year: 2023).*

*Primary Examiner* — Duy Vu N Deo
*Assistant Examiner* — Christopher Remavege
(74) *Attorney, Agent, or Firm* — Myers Bigel, P.A.

(57) ABSTRACT

A photoresist-removing composition includes a polar organic solvent, an alkyl ammonium hydroxide, an aliphatic amine not including a hydroxy group, and a monovalent alcohol. To manufacture a semiconductor device, a photoresist pattern may be formed on a substrate, and the photoresist-removing composition may then be applied to the photoresist pattern. To manufacture a semiconductor package, a photoresist pattern including a plurality of via holes may be formed on a substrate. A plurality of conductive (Continued)

posts including a metal may be formed inside the plurality of via holes, and the photoresist pattern may be removed by applying a photoresist-removing composition of the inventive concept to the photoresist pattern. A semiconductor chip may be adhered to the substrate between the respective conductive posts.

20 Claims, 14 Drawing Sheets

(51) Int. Cl.
  *C11D 3/04* (2006.01)
  *H01L 21/02* (2006.01)
(58) Field of Classification Search
  CPC ............... C11D 3/044; H01L 21/0206; H01L 21/31133; H01L 21/0274; H01L 21/31144
  See application file for complete search history.

(56) References Cited

U.S. PATENT DOCUMENTS

| | | | |
|---|---|---|---|
| 8,883,699 B2 | 11/2014 | Kim et al. | |
| 9,146,471 B2 | 9/2015 | Klipp | |
| 9,562,211 B2 | 2/2017 | Takahashi et al. | |
| 9,914,902 B2 | 3/2018 | Du et al. | |
| 11,460,778 B2 * | 10/2022 | Peters | C11D 7/3218 |
| 2002/0128164 A1 * | 9/2002 | Hara | C11D 3/3947 |
| | | | 257/E21.228 |
| 2002/0130298 A1 * | 9/2002 | Ichiki | G03F 7/425 |
| | | | 257/E21.255 |
| 2003/0186175 A1 * | 10/2003 | Ikemoto | H01L 21/02071 |
| | | | 430/331 |
| 2004/0029753 A1 * | 2/2004 | Ikemoto | C11D 7/10 |
| | | | 134/2 |
| 2004/0081922 A1 * | 4/2004 | Ikemoto | G03F 7/425 |
| | | | 510/176 |
| 2004/0256358 A1 * | 12/2004 | Shimizu | H01L 21/02052 |
| | | | 257/E21.255 |
| 2010/0317185 A1 * | 12/2010 | Vos | H01L 21/823857 |
| | | | 438/591 |
| 2012/0040529 A1 * | 2/2012 | Klipp | C11D 3/26 |
| | | | 257/E21.585 |
| 2012/0058644 A1 * | 3/2012 | Klipp | H01L 21/02063 |
| | | | 510/176 |
| 2014/0142017 A1 * | 5/2014 | Peters | C11D 7/3281 |
| | | | 510/176 |
| 2015/0219996 A1 * | 8/2015 | Peters | C11D 7/3209 |
| | | | 510/176 |
| 2016/0252819 A1 * | 9/2016 | Sugishima | H01L 29/0847 |
| | | | 430/258 |
| 2017/0115573 A1 * | 4/2017 | Park | C11D 3/0073 |
| 2017/0200619 A1 * | 7/2017 | Cooper | C11D 7/36 |
| 2019/0079409 A1 * | 3/2019 | Takahashi | G03F 7/425 |
| 2019/0317409 A1 * | 10/2019 | Peters | C11D 7/261 |
| 2022/0350253 A1 * | 11/2022 | Yun | H01L 21/0206 |

FOREIGN PATENT DOCUMENTS

| | | | |
|---|---|---|---|
| JP | 6556834 B2 | 8/2019 | |
| KR | 10-2007-0043663 A | 4/2007 | |
| KR | 10-2010-0033006 A | 3/2010 | |
| KR | 10-2011-0112181 A | 10/2011 | |
| KR | 10-1710171 B1 | 2/2017 | |
| KR | 10-1733729 B1 | 5/2017 | |
| KR | 10-2017-0127527 A | 11/2017 | |
| KR | 10-1880302 B1 | 7/2018 | |
| TW | 201723165 A | 7/2017 | |
| TW | 202026413 A | 7/2020 | |
| WO | 2017065153 A1 | 4/2017 | |
| WO | WO-2017065153 A1 * | 4/2017 | ............... G03F 7/42 |

* cited by examiner

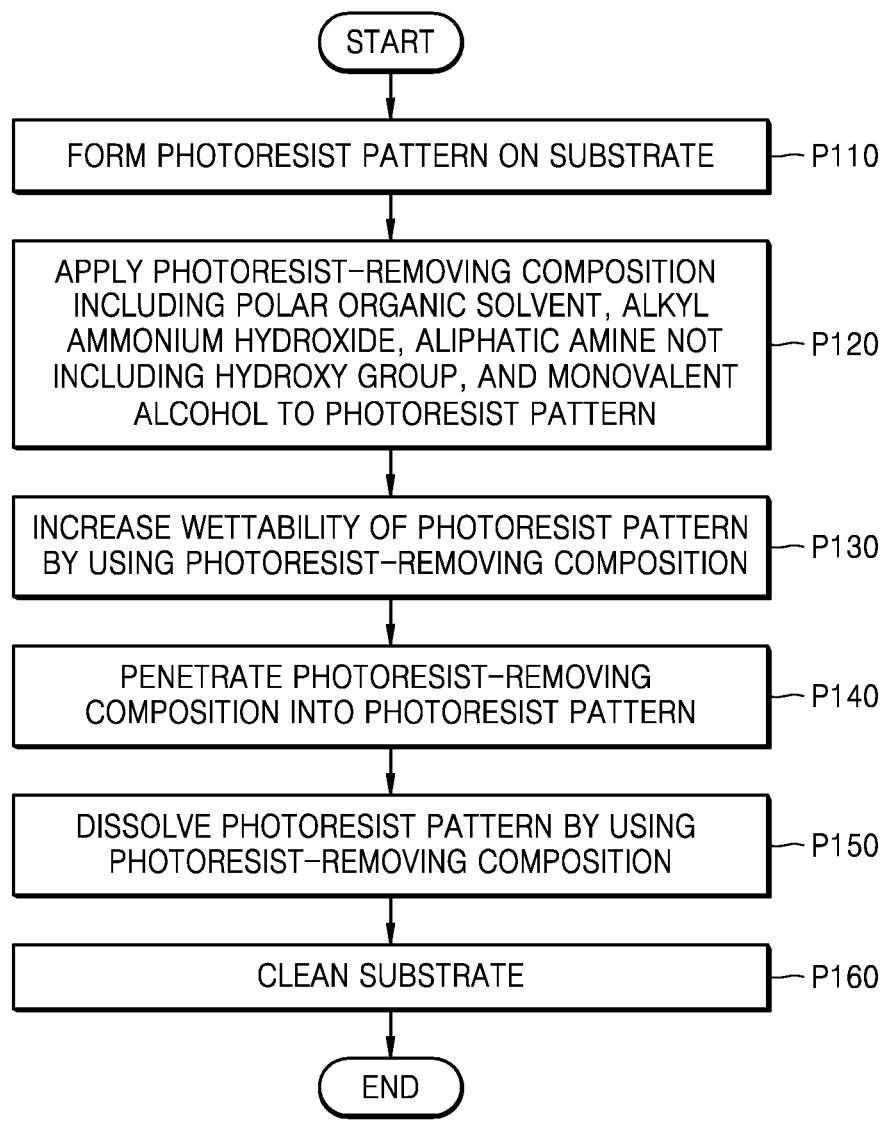

COMPOSITIONS FOR REMOVING PHOTORESISTS AND METHODS OF MANUFACTURING SEMICONDUCTOR DEVICES AND SEMICONDUCTOR PACKAGES USING THE COMPOSITIONS

CROSS-REFERENCE TO RELATED APPLICATION

This application is based on and claims priority under 35 U.S.C. § 119 to Korean Patent Application No. 10-2021-0057482, filed on May 3, 2021, in the Korean Intellectual Property Office, the disclosure of which is incorporated by reference herein in its entirety.

BACKGROUND

The inventive concept relates to a composition for removing a photoresist (hereinafter, inclusively referred to as a "photoresist-removing composition") and methods of manufacturing a semiconductor device and a semiconductor package using the photoresist-removing composition, and more particularly, to a photoresist-removing composition for removing a photoresist pattern used in a process of manufacturing unit elements and methods of manufacturing a semiconductor device and a semiconductor package using the photoresist-removing composition.

After a photoresist pattern is used for various purposes in a semiconductor package manufacturing process, the photoresist pattern may be removed. When the photoresist pattern is removed, removing the photoresist pattern while not leaving residue of the photoresist pattern without adversely affecting (e.g., corroding) a metal-containing structure around the photoresist pattern may be desirable.

SUMMARY

The inventive concept provides a photoresist-removing composition, which may cleanly remove a photoresist pattern used in a process of manufacturing a unit element, without adversely affecting (e.g., corroding) metal-containing components around the photoresist pattern.

The inventive concept also provides a method of manufacturing a semiconductor device and a method of manufacturing a semiconductor package that may improve productivity by cleanly removing a photoresist pattern used in a process of manufacturing a unit element, without adversely affecting (e.g., corroding) a metal-containing structure around the photoresist pattern.

According to an aspect of the inventive concept, there is provided a photoresist-removing composition that includes a polar organic solvent, an alkyl ammonium hydroxide, an aliphatic amine not including a hydroxy group, and a monovalent alcohol.

According to another aspect of the inventive concept, there is provided a method of manufacturing a semiconductor device. The method includes forming a photoresist pattern on a substrate. A photoresist-removing composition may then be applied to the photoresist pattern to remove the photoresist pattern. The photoresist-removing composition may include a polar organic solvent, an alkyl ammonium hydroxide, an aliphatic amine not including a hydroxy group, and a monovalent alcohol.

According to another aspect of the inventive concept, there is provided a method of manufacturing a semiconductor package. The method includes forming a photoresist pattern including a plurality of via holes on a substrate. A plurality of conductive posts including a metal may be formed inside the plurality of via holes. A photoresist-removing composition may then be applied to the photoresist pattern to remove the photoresist pattern. The photoresist-removing composition may include a polar organic solvent, an alkyl ammonium hydroxide, an aliphatic amine not including a hydroxy group, and a monovalent alcohol. A semiconductor chip may then be adhered to the substrate between the respective conductive posts. A molding layer configured to mold the semiconductor chip may then be formed between the semiconductor chip and each of the plurality of conductive posts.

BRIEF DESCRIPTION OF THE DRAWINGS

Some embodiments of the inventive concept will be more clearly understood from the following detailed description taken in conjunction with the accompanying drawings in which:

FIG. 1 is a flowchart of a method of manufacturing a semiconductor device, according to some embodiments of the inventive concept.

DETAILED DESCRIPTION

Figure 2A:
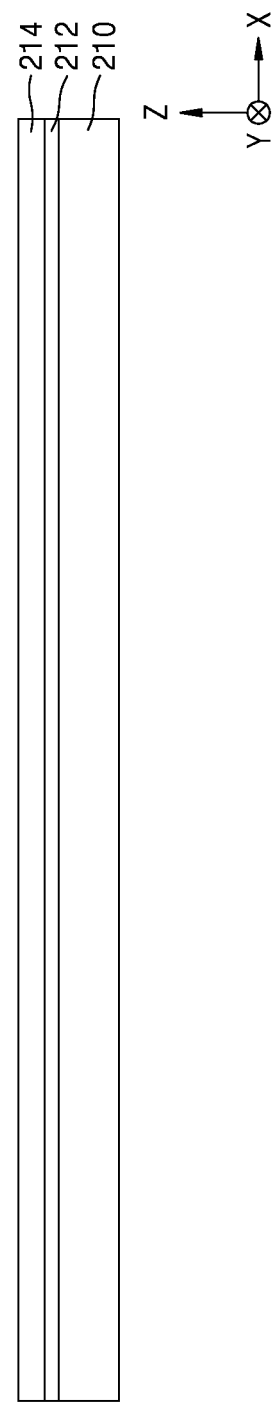
FIGS. 2A, 2B, 2C, 2D, 2E, 2F, 2G, 2H, 2I, 2J, 2K 2L and 2M are cross-sectional views illustrating a method of manufacturing a semiconductor device, according to some embodiments of the inventive concept.

Hereinafter, some embodiments of the inventive concept will be described in detail with reference to the accompanying drawings. The same reference numerals are used to denote the same elements in the drawings, and repeated descriptions thereof may be omitted.

Photoresist-removing compositions according to some embodiments of the inventive concept may include a polar organic solvent, an alkyl ammonium hydroxide, an aliphatic amine not including a hydroxy group, and monovalent alcohol.

In photoresist-removing compositions according to some embodiments of the inventive concept, the polar organic solvent may improve the wettability of a surface of a photoresist pattern to be removed when the polar organic solvent is in contact with the surface of the photoresist pattern to be removed. Also, the polar organic solvent may swell the photoresist pattern by penetrating into the photoresist pattern and may dissolve a decomposed product of the photoresist pattern that has decomposed due to contact with the photoresist-removing composition.

In example embodiments, the polar organic solvent may include sulfoxide solvents such as dimethyl sulfoxide (DMSO); glycol ether solvents, such as ethylene glycolmonomethyl ether, ethylene glycol monoethyl ether (EGEE), and ethylene glycol monobutyl ether; sulfone solvents, such as dimethyl sulfone, diethyl sulfone, and tetramethylene sulfone; sulfolane; lactam solvents, such as N-methyl-2-pyrrolidone (NMP), and N-ethyl-2-pyrrolidone; lactone solvents, such as gamma-butyrolactone; imidazolidinone solvents, such as 1,3-dimethyl-2-imidazolidinone (DMI); amide solvents, such as acetamide, N-methyl formamide, N,N-dimethyl formamide, N,N-dimethyl acetamide, N,N-dimethylpropionamide, and N,N-bis(2-hydroxyethyl)formamide; or a combination thereof.

In example embodiments, the polar organic solvent may include dimethyl sulfoxide, EGEE, NMP, DMI, or a combination thereof. For example, the polar organic solvent may include a combination of dimethyl sulfoxide and NMP. In this case, a volume ratio of dimethyl sulfoxide to NMP in the polar organic solvent may be, for example, in a range of about 7:3 to about 9:1, without being limited thereto.

The polar organic solvent may be included in an amount of about 65% to about 90% by weight, based on the total weight of the photoresist-removing composition. When the amount of the polar organic solvent is less than about 65% by weight, the solubility of the photoresist pattern by the photoresist-removing composition may be reduced, and thus, the photoresist pattern may not be cleanly removed or may include substantial residue. When the amount of the polar organic solvent exceeds about 90% by weight, the concentration of the other components in the photoresist-removing composition may be relatively reduced, and thus, the peeling performance of the photoresist pattern may be reduced and/or corrosion of a metal-containing structure around the photoresist pattern to be removed may occur.

In photoresist-removing compositions according to some embodiments of the inventive concept, the alkyl ammonium hydroxide may penetrate into the photoresist pattern to be removed and destroy and/or decompose bonds between molecules in the photoresist pattern.

In some embodiments, the alkyl ammonium hydroxide may include a tetra alkyl ammonium hydroxide including a C1 to C4 alkyl group. For example, the alkyl ammonium hydroxide may include tetramethylammonium hydroxide (TMAH), tetraethylammonium hydroxide (TEAH), or tetrabutylammonium hydroxide (TBAH), without being limited thereto.

The alkyl ammonium hydroxide may be included in an amount of about 1% to about 10% by weight, based on the total weight of the photoresist-removing composition. When the amount of the alkyl ammonium hydroxide is less than about 1% by weight, the peeling performance of the photoresist pattern by the photoresist-removing composition may be reduced. When the amount of the alkyl ammonium hydroxide exceeds about 10% by weight, corrosion of the metal-containing structure(s) around the photoresist pattern to be removed may occur.

In photoresist-removing compositions according to some embodiments of the inventive concept, similar to the role of alkyl ammonium hydroxide, the aliphatic amine not including a hydroxy group may penetrate into the photoresist pattern to be removed and destroy and/or decompose bonds between molecules in the photoresist. In addition, the aliphatic amine not including a hydroxy group may facilitate peeling of the photoresist pattern.

The aliphatic amine not including a hydroxy group refers to any aliphatic amine that does not include a hydroxy functional group in the compound. In some embodiments, the aliphatic amine not including a hydroxy group may include ethylamine, isopropylamine, dimethylbutylamine (DMBA), diisopropylethyl amine, and/or an aliphatic polyamine, without being limited to thereto. As used herein the term "and/or" includes any and all combinations of one or more of the associated listed items.

In some embodiments, the aliphatic polyamine may include an amine compound having at least two amino groups, such as, for example, two to ten amino groups. For example, the aliphatic polyamine may include an amine compound having at least three to five amino groups.

The aliphatic polyamine may include polyamine having a linear and/or branched hydrocarbon groups. For example, in some embodiments, the aliphatic polyamine may include ethylenediamine (EDA), dimethylaminoethylmethylamine, 1,2-propylenediamine, 1,3-propylenediamine, 1,4-butanediamine, 1,3-diaminopentane, hexamethylenediamine, 2-methyl-pentamethylenediamine, neopentane diamine, (2,2,4)-trimethylhexamethylenediamine (TMD), (2,4,4)-trimethylhexamethylenediamine (TMD), 1,6-hexamethylenediamine, diethylenetriamine (DETA), triethylenetramine (TETA), tetraethylenepentamine (TEPA), pentaethylene hexamine, or a combination thereof, without being limited thereto.

In some embodiments, the aliphatic amine not including a hydroxy group may be included in an amount of about 1% to about 10% by weight, based on the total weight of the photoresist-removing composition. When the amount of the aliphatic amine not including a hydroxy group is less than about 1% by weight, the peeling performance of the photoresist pattern by the photoresist-removing composition may be reduced. When the amount of the aliphatic amine not including a hydroxy group exceeds about 10% by weight, corrosion of the metal-containing structure(s) around the photoresist pattern to be removed may occur.

In photoresist-removing compositions according to some embodiments of the inventive concept, when the monovalent alcohol is in contact with the surface of the photoresist pattern to be removed, the monovalent alcohol may increase a decomposition rate of the photoresist pattern by lowering the surface tension of the surface of the photoresist pattern and improving wettability. Also, the monovalent alcohol may swell the photoresist pattern by penetrating into the photoresist pattern. In addition, the monovalent alcohol may increase a decomposition rate of the photoresist pattern, which has decomposed due to the photoresist-removing composition according to embodiments of the inventive concept.

In example embodiments, the monovalent alcohol may include methanol (MeOH), ethanol (EtOH), propanol, butanol, isopropyl alcohol (IPA), isobutanol, ethylene glycol (EG), propylene glycol (PG), or a combination thereof, without being limited thereto.

In some embodiments, the monovalent alcohol may be included in an amount of about 1% to about 15% by weight, based on the total weight of the photoresist-removing composition. When the amount of the monovalent alcohol is less than about 1% by weight, a dissolution rate of the photoresist pattern due to the photoresist-removing composition may be insufficient, and thus, a relatively thick photoresist pattern (e.g., a photoresist pattern having a thickness of about 50 µm to about 400 µm) may be lifted off. Lifted-off pieces of the photoresist pattern may remain in a floated or separated state on the substrate supporting the photoresist pattern to be removed, thereby causing physical damage to unit elements on the substrate. When the amount of the monovalent alcohol exceeds about 15% by weight, the concentration of the other components in the photoresist-removing composition may be relatively reduced, and thus, the peeling performance of the photoresist pattern may be reduced and or corrosion of the metal-containing structure around the photoresist pattern to be removed may occur.

As a comparative example, when a photoresist-removing composition includes a dihydric alcohol (e.g., ethylene glycol) and/or a trihydric alcohol (e.g., glycerin), the wettability of the photoresist pattern may be reduced by increasing the surface tension of the photoresist pattern to be removed. As a result, unlike the monovalent alcohol, the dihydric alcohol and/or the trihydric alcohol may reduce a surface dissolution rate of the photoresist pattern to be removed.

Photoresist-removing compositions according to some embodiments of the inventive concept may further include a corrosion inhibitor.

The corrosion inhibitor may reduce or prevent the corrosion of the metal-containing structure(s) around the photoresist pattern to be removed.

In example embodiments, the corrosion inhibitor may include at least one selected from an azole-based compound and hydroxylamine. The azole-based compound is a compound that includes an azole ring. For example, in some embodiments, the azole-based corrosion inhibitor may be selected from benzotriazole, tolytriazole, carboxylic benzotriazole, 1,2,3,4-tetrazole, 5-amino tetrazole, imidazole, benzimidazole, 6-aminopurine, adenine, and any combination thereof.

In some embodiments, the corrosion inhibitor may be included in the photoresist-removing compositions in an amount of about 0.001% to about 1% by weight of the photoresist-removing composition.

Photoresist-removing compositions according to some embodiments of the inventive concept may further include water. In some embodiments, the water may be deionized water.

When the photoresist-removing compositions include the polar organic solvent, the alkyl ammonium hydroxide, the aliphatic amine not including a hydroxy group, the monovalent alcohol, and the water, the amount of water in the photoresist-removing composition may be the remaining amount excluding the amount of each of the polar organic solvent, the alkyl ammonium hydroxide, the aliphatic amine not including a hydroxy group, and the monovalent alcohol.

When the photoresist-removing composition includes the polar organic solvent, the alkyl ammonium hydroxide, the aliphatic amine not including a hydroxy group, the monovalent alcohol, the corrosion inhibitor, and the water, the amount of water in the photoresist-removing composition may be the remaining amount excluding the amount of each of the polar organic solvent, the alkyl ammonium hydroxide, the aliphatic amine not including a hydroxy group, the monovalent alcohol, and the corrosion inhibitor.

FIG. 1 is a flowchart of a method of manufacturing a semiconductor device, according to some embodiments of the inventive concept.

In process P110 of FIG. 1, a photoresist pattern may be formed on a substrate.

The substrate may include a carrier substrate or a semiconductor substrate. In example embodiments, the carrier substrate may include, for example, glass, polyimide, poly(etheretherketone) (PEEK), poly(ethersulfone) (PES), and/or poly(phenylene sulfide) (PPS). The semiconductor substrate may include a semiconductor element, such as silicon (Si) and germanium (Ge), or a compound semiconductor, such as silicon carbide (SiC), gallium arsenide (GaAs), indium arsenide (InAs), and indium phosphide (InP), without being limited thereto.

In example embodiments, the photoresist pattern may include a negative-type photoresist pattern cured due to a cross-linking reaction. For example, the photoresist pattern may be a cured photoresist pattern obtained by causing a crosslinking reaction due to exposure to light of at least a portion of a photoresist film that is formed using a negative-type photoresist composition including, for example, a (meth)acrylate copolymer, a styrenic copolymer, a base-soluble resin (binder resin) using a novolak resin as a base, a crosslinking agent, and a photo-radical generator.

In example embodiments, the photoresist pattern may have a thickness of about 50 μm to about 400 μm. For example, the photoresist pattern may have a thickness of about 100 μm to about 300 μm.

At least one metal-containing structure adjacent to the photoresist pattern may be formed on the substrate. In some embodiments, the at least one metal-containing structure may include copper (Cu).

In process P120 of FIG. 1, a photoresist-removing composition according to some embodiments of the inventive concept, that is, a photoresist-removing composition including a polar organic solvent, an alkyl ammonium hydroxide, an aliphatic amine not including a hydroxy group, and a monovalent alcohol, may be applied to a surface of the photoresist pattern formed in process P110.

In example embodiments, a process, such as a dipping process, a spin coating process, a dip coating process, and/or a spray coating process, may be used to apply the photoresist-removing composition to a surface of the photoresist pattern, but a method of applying the photoresist-removing composition is not limited thereto.

During the application of the photoresist-removing composition to the surface of the photoresist pattern, the at least one metal-containing structure may also be applied to (e.g., contact) the photoresist-removing composition.

In process P130 of FIG. 1, while the photoresist-removing composition is in contact with the photoresist pattern, the wettability of the photoresist pattern may be increased by using the photoresist-removing composition.

From among components included in the photoresist-removing composition, in particular, the polar organic solvent and the monovalent alcohol may contribute toward increasing the wettability of the photoresist pattern.

In process P140 of FIG. 1, the photoresist-removing composition may penetrate into the photoresist pattern while the photoresist-removing composition is in contact with the photoresist pattern.

From among the components included in the photoresist-removing composition, in particular, the polar organic solvent may swell the photoresist pattern by penetrating into the photoresist pattern, and the monovalent alcohol may increase a swelling rate due to the polar organic solvent, and the alkyl ammonium hydroxide may break and decompose bonds between the components of the photoresist pattern, and the aliphatic amine not including the hydroxy group may assist the alkyl ammonium hydroxide in decomposing the photoresist pattern. Because the photoresist-removing composition penetrates into the photoresist pattern, chemical reactions between the components of the photoresist-removing composition and the components of the photoresist pattern may occur in the photoresist pattern. As a result, the decomposition of the photoresist pattern may be facilitated.

In process P150 of FIG. 1, the photoresist pattern may be dissolved using the photoresist-removing composition.

From among the components included in the photoresist-removing composition, in particular, the polar organic solvent and monovalent alcohol may contribute toward dissolving the photoresist-removing composition. By dissolving the photoresist pattern, it is meant that at least part of the photoresist pattern may be dissolved state in the photoresist-removing composition. Pieces of the photoresist pattern, which are not completely dissolved by the photoresist-removing composition, may be dispersed as fine particles in the photoresist-removing composition, and thus, other unit elements on the substrate may not be adversely affected.

When a metal-containing structure (e.g., a copper-containing structure) is on the substrate, a composition further including a corrosion inhibitor may be included in the photoresist-removing composition. In this case, during processes P120 to P150 of FIG. 1, the corrosion inhibitor may reduce or prevent the corrosion of the metal-containing structure.

In process P160 of FIG. 1, the dissolved photoresist composition may be removed from the substrate by cleaning the substrate.

The photoresist-removing composition may be water-soluble and easily washed off by deionized water (DIW). Accordingly, in some embodiments, a decomposed product of the photoresist pattern that has undergone processes P120 to P150 of FIG. 1 may be cleanly removed from the substrate by a cleaning process using DIW according to process P160. After the decomposed product of the photoresist pattern is removed from the substrate using DIW, in some embodiments, residue of the photoresist pattern may not remain on the substrate.

FIGS. 2A to 2M are cross-sectional views illustrating a method of manufacturing a semiconductor package, according to some embodiments of the inventive concept.

Referring to FIG. 2A, a stack structure of a carrier substrate 210, a release film 212, and a cover layer 214 may be formed.

The carrier substrate 210 may include, for example, glass, polyimide, PEEK, PES, and/or PPS.

The release film 212 may be a laser reaction layer, which can be vaporized in response to laser irradiation in a subsequent process to separate the carrier substrate 210. The release film 212 may include a carbon-containing film. For example, the release film 212 may include an amorphous carbon layer (ACL) film or a spin-on hardmask (SOH) film. In some embodiments, the SOH film may include a hydrocarbon compound having a relatively high carbon content of about 85% to about 99% by weight or a derivative thereof.

The cover layer 214 may include, for example, photosensitive polyimide, oxide, nitride, or a combination thereof.

Figure 2B:
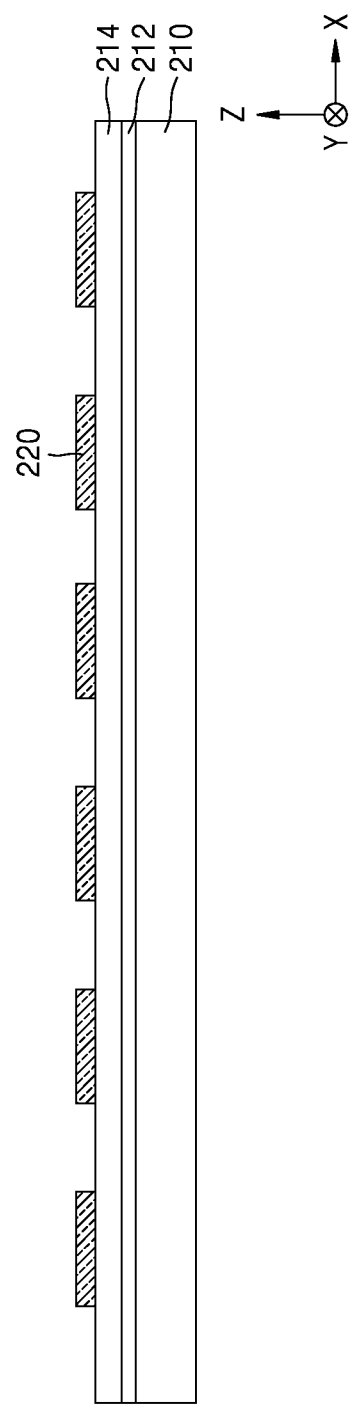

Referring to FIG. 2B, a plurality of external electrode pads 220 may be formed on the cover layer 214.

Figure 2C:
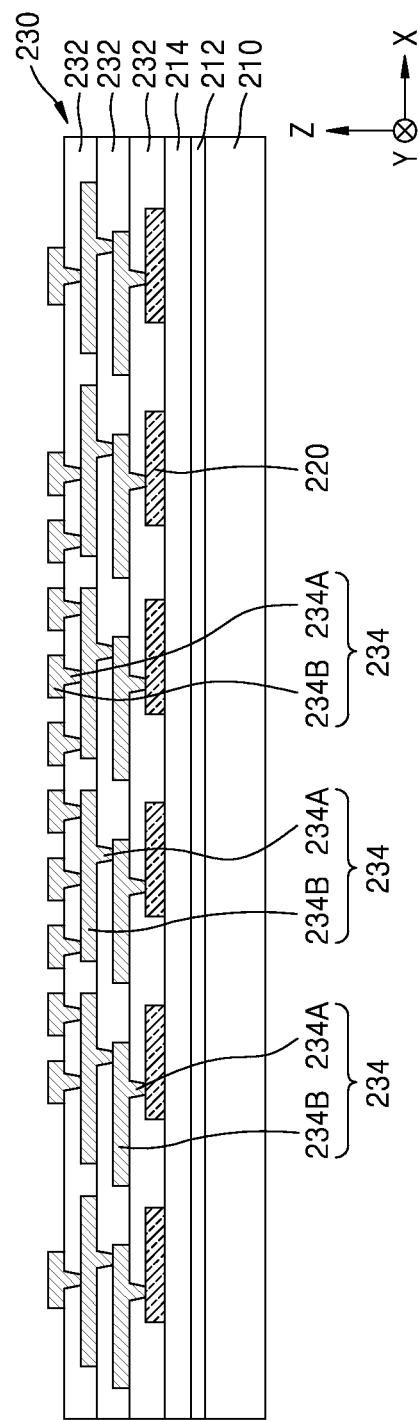
Figure 2D:
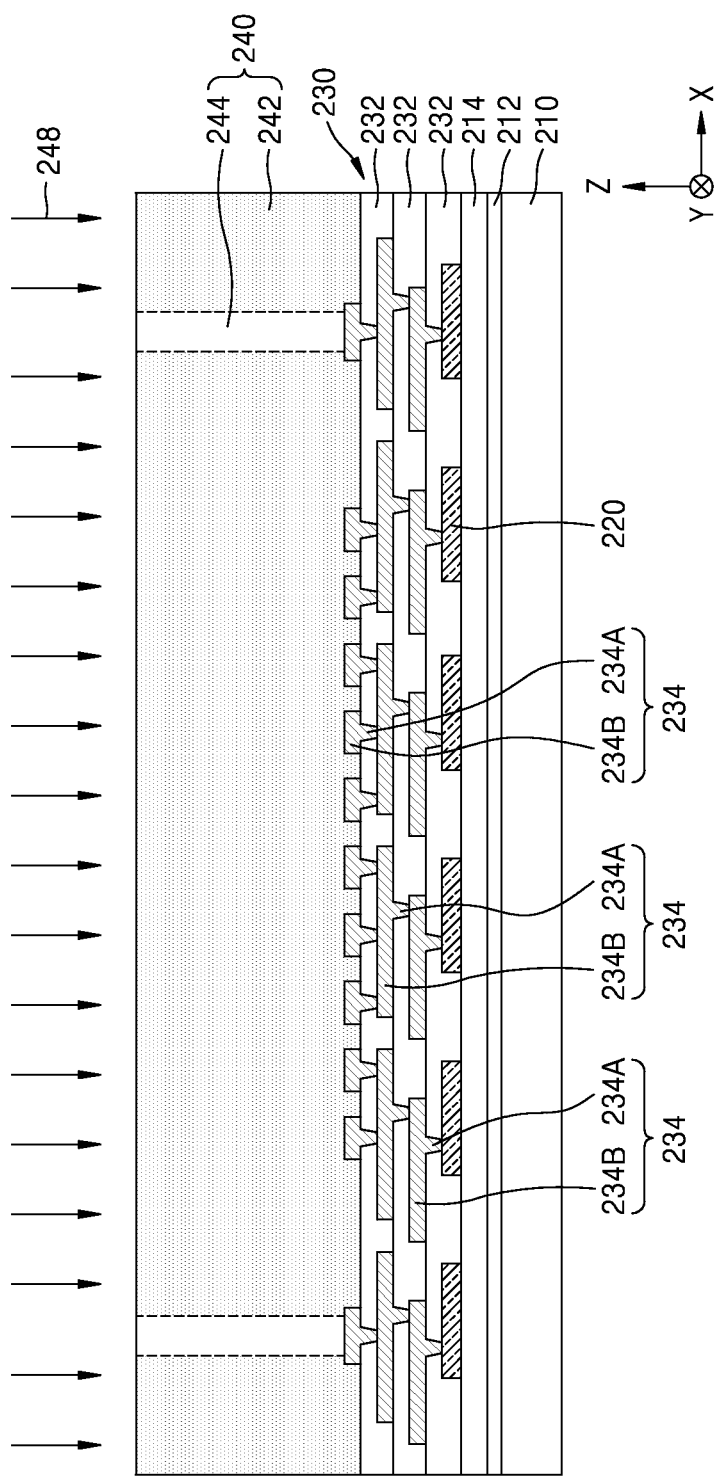
Figure 2E:
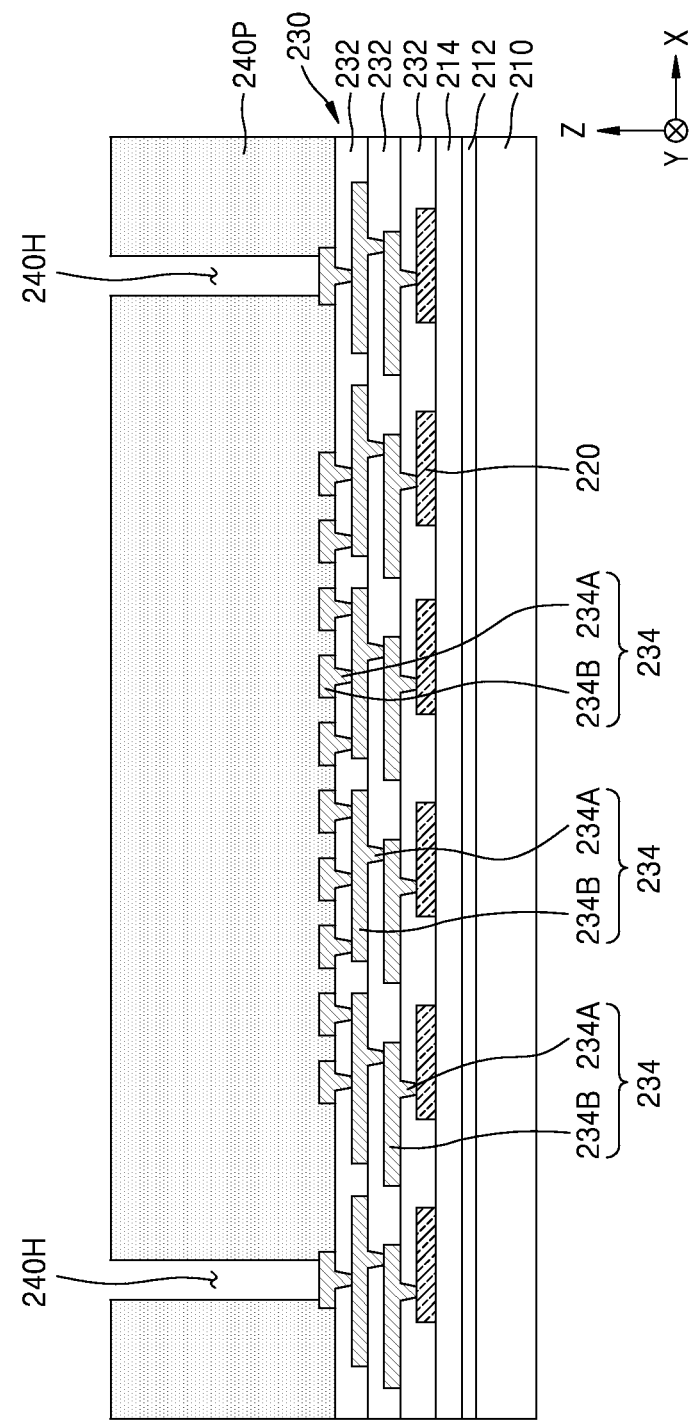
Figure 2F:
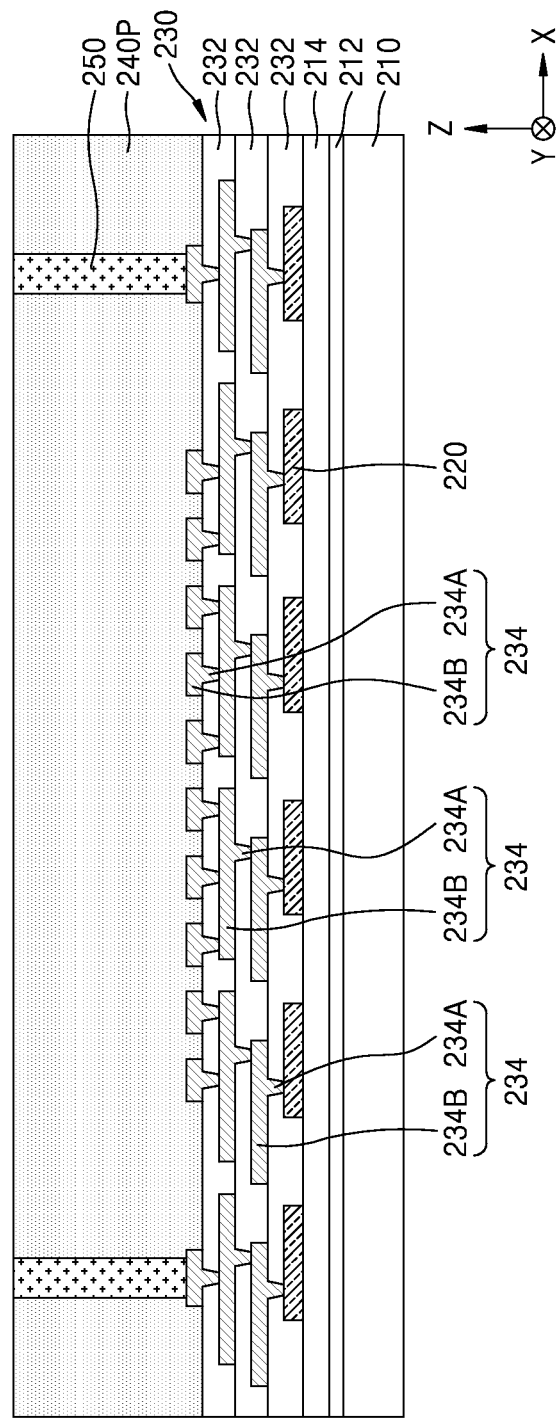
Figure 2G:
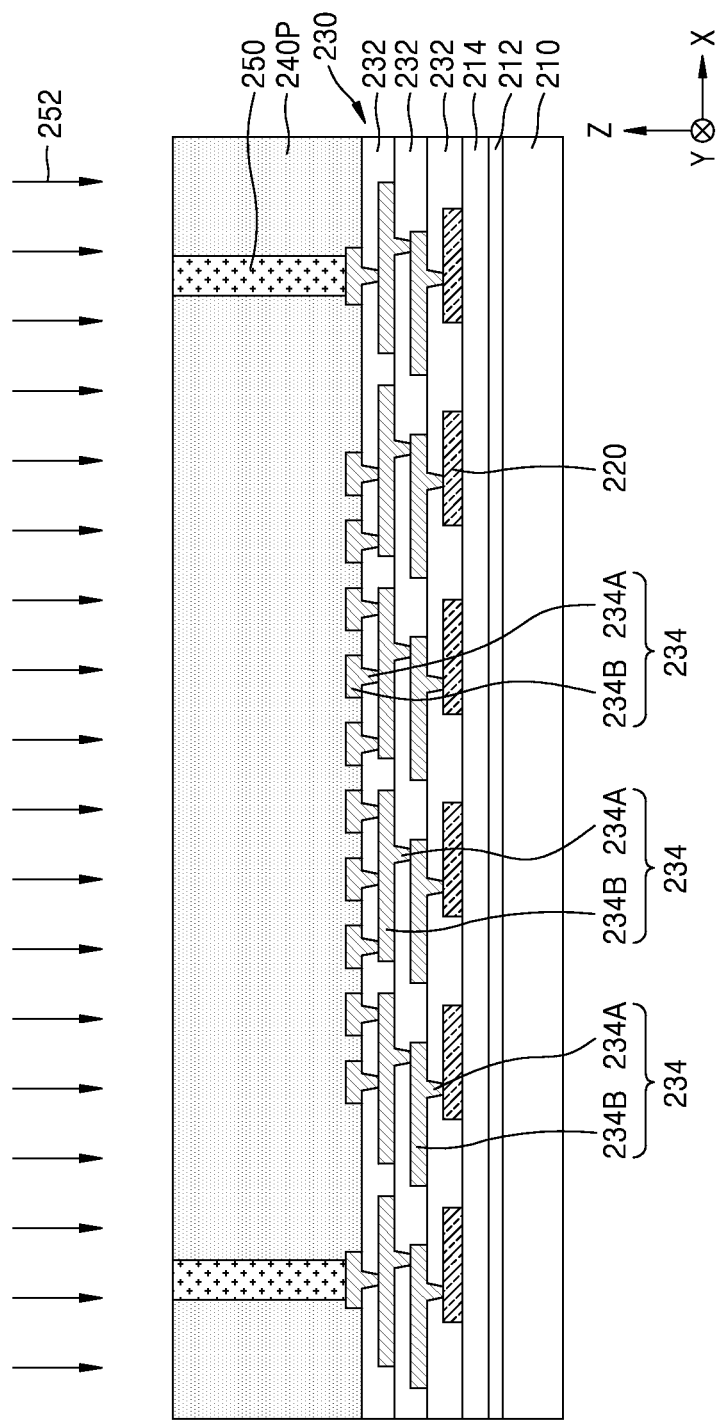
Figure 2H:
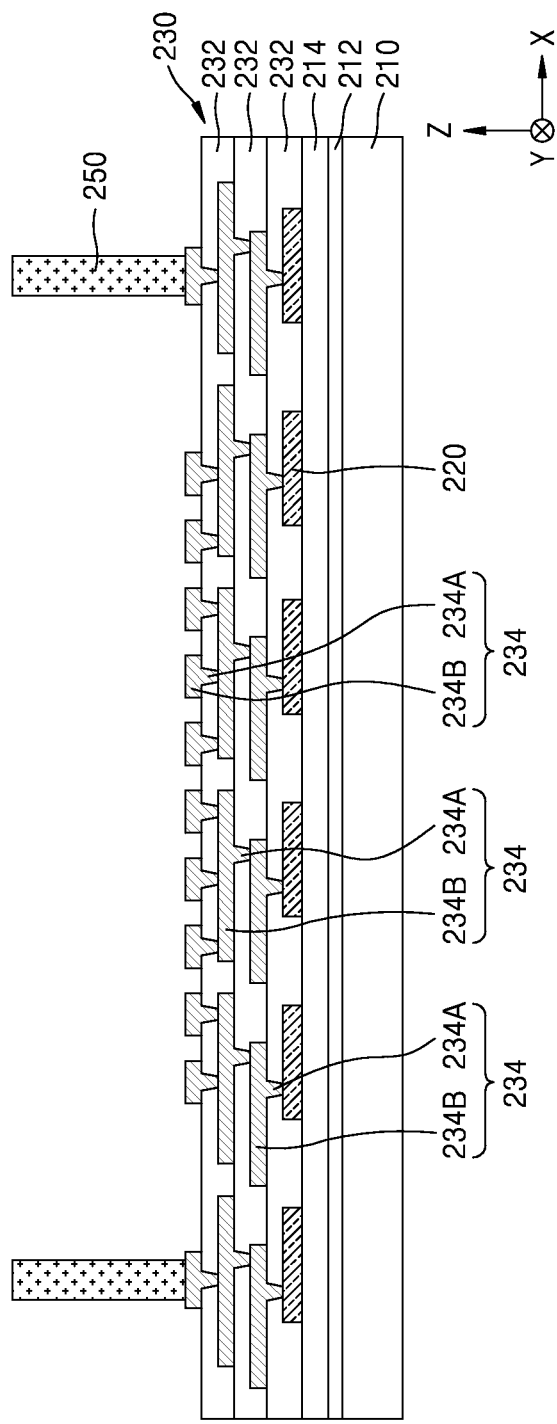
Figure 2I:
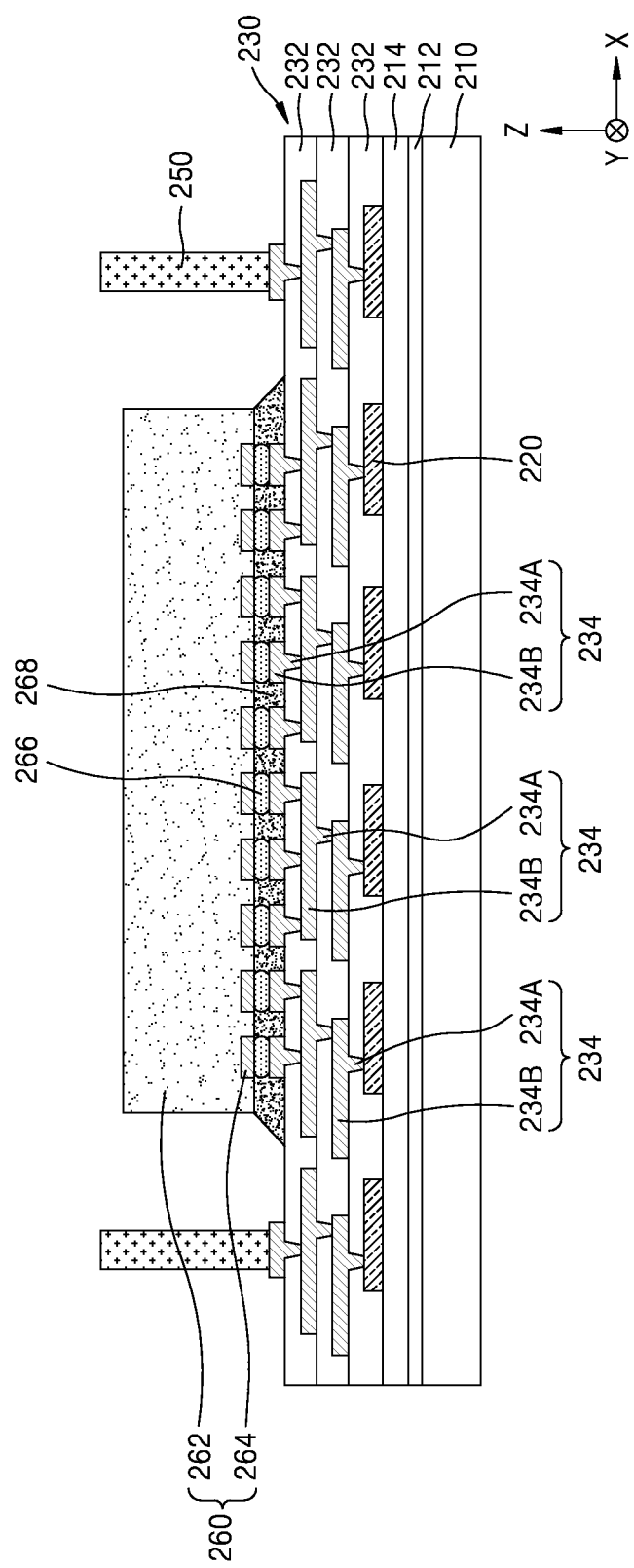
Figure 2J:
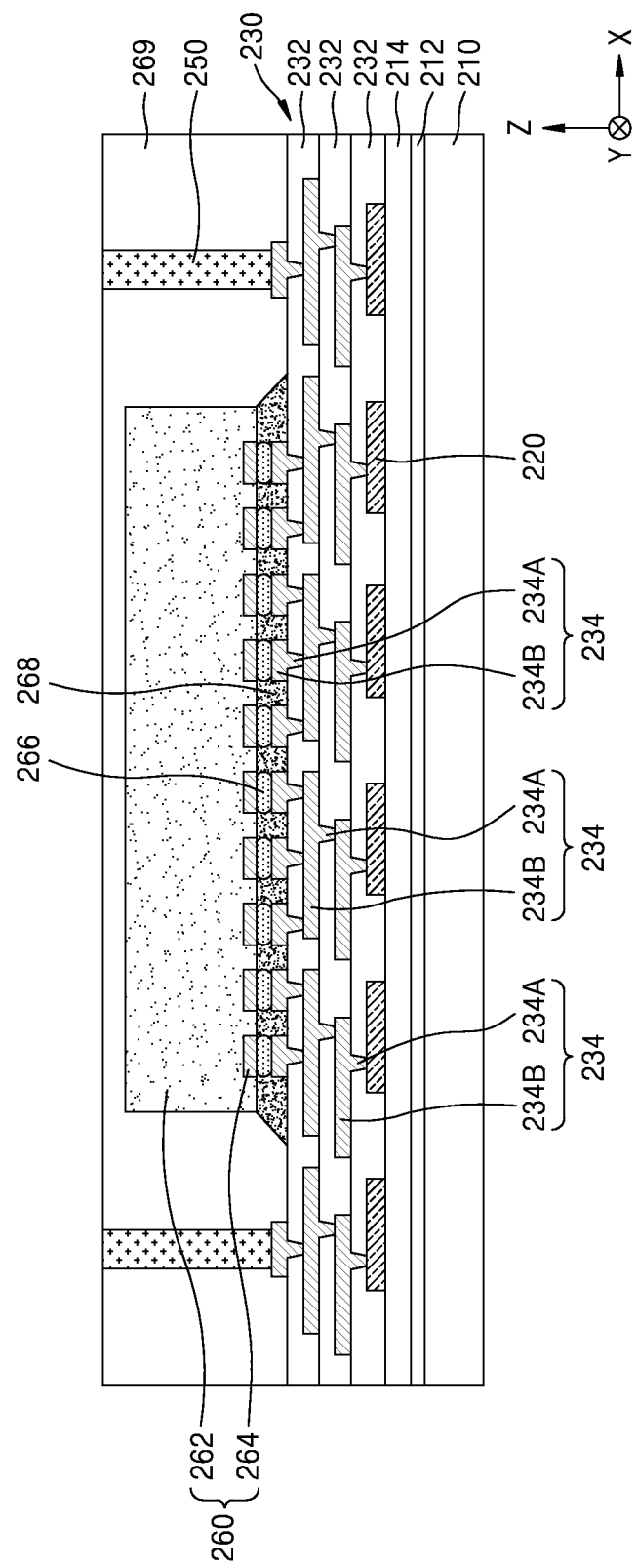
Figure 2K:
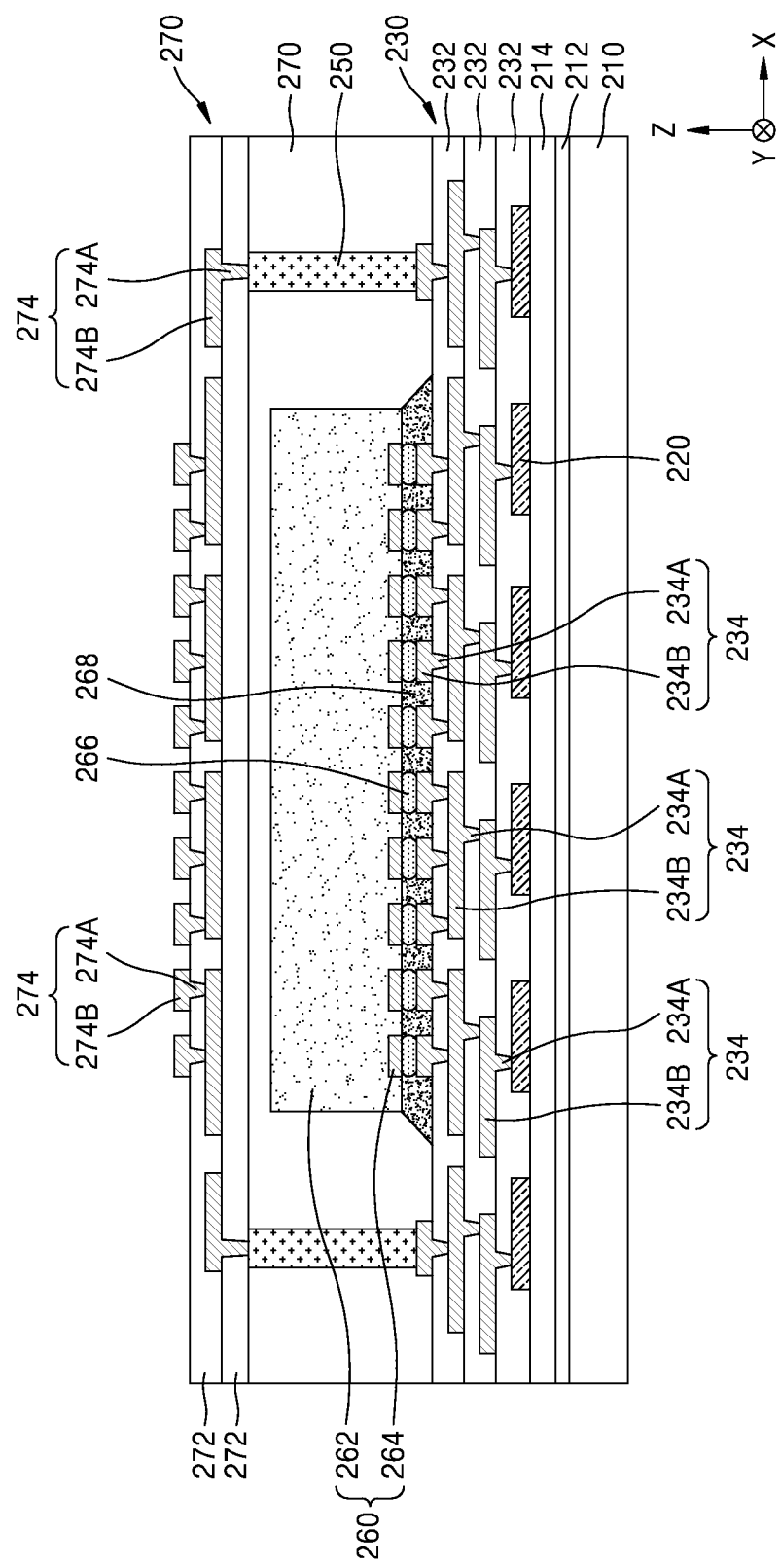
Figure 2L:
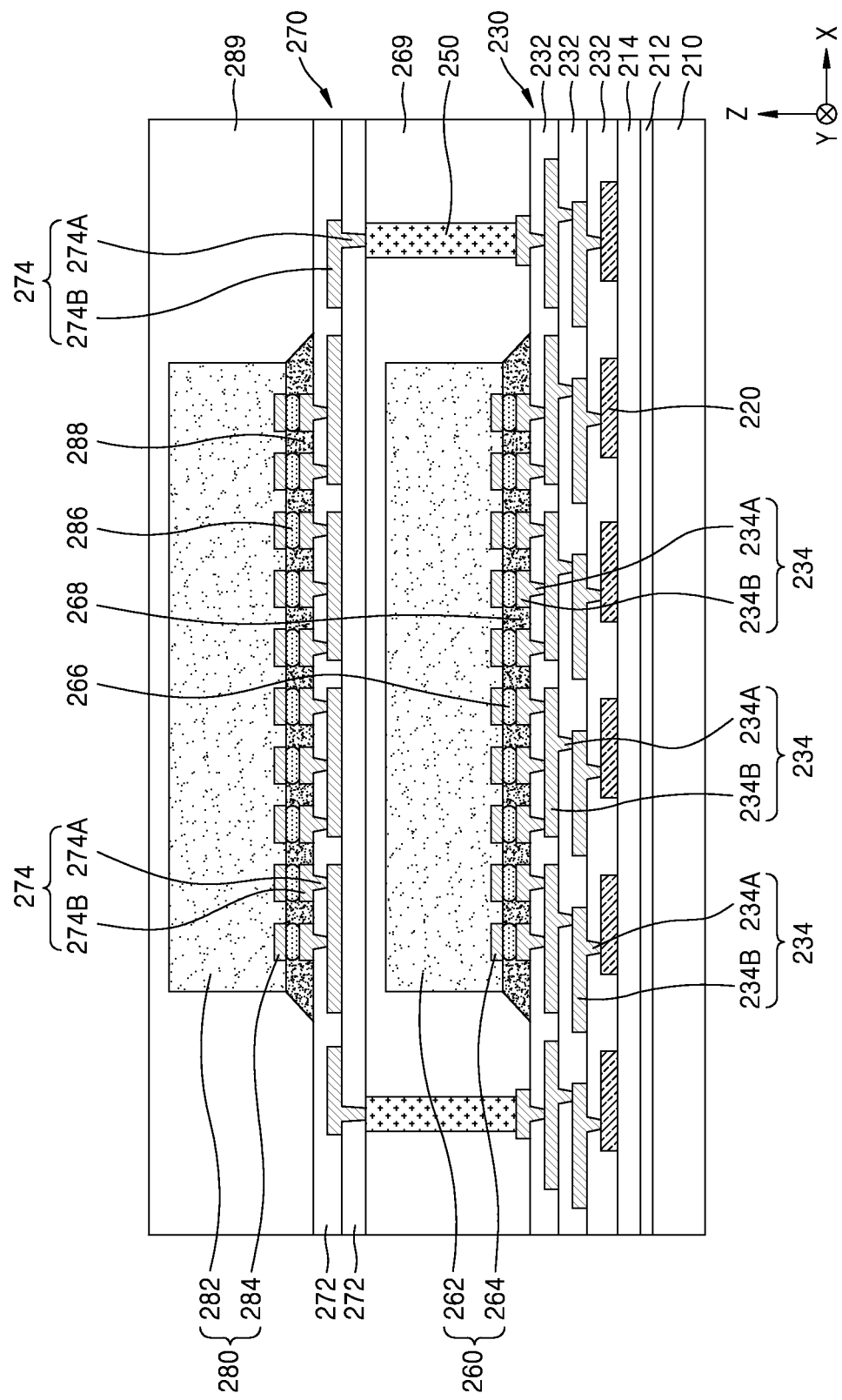
Figure 2M:
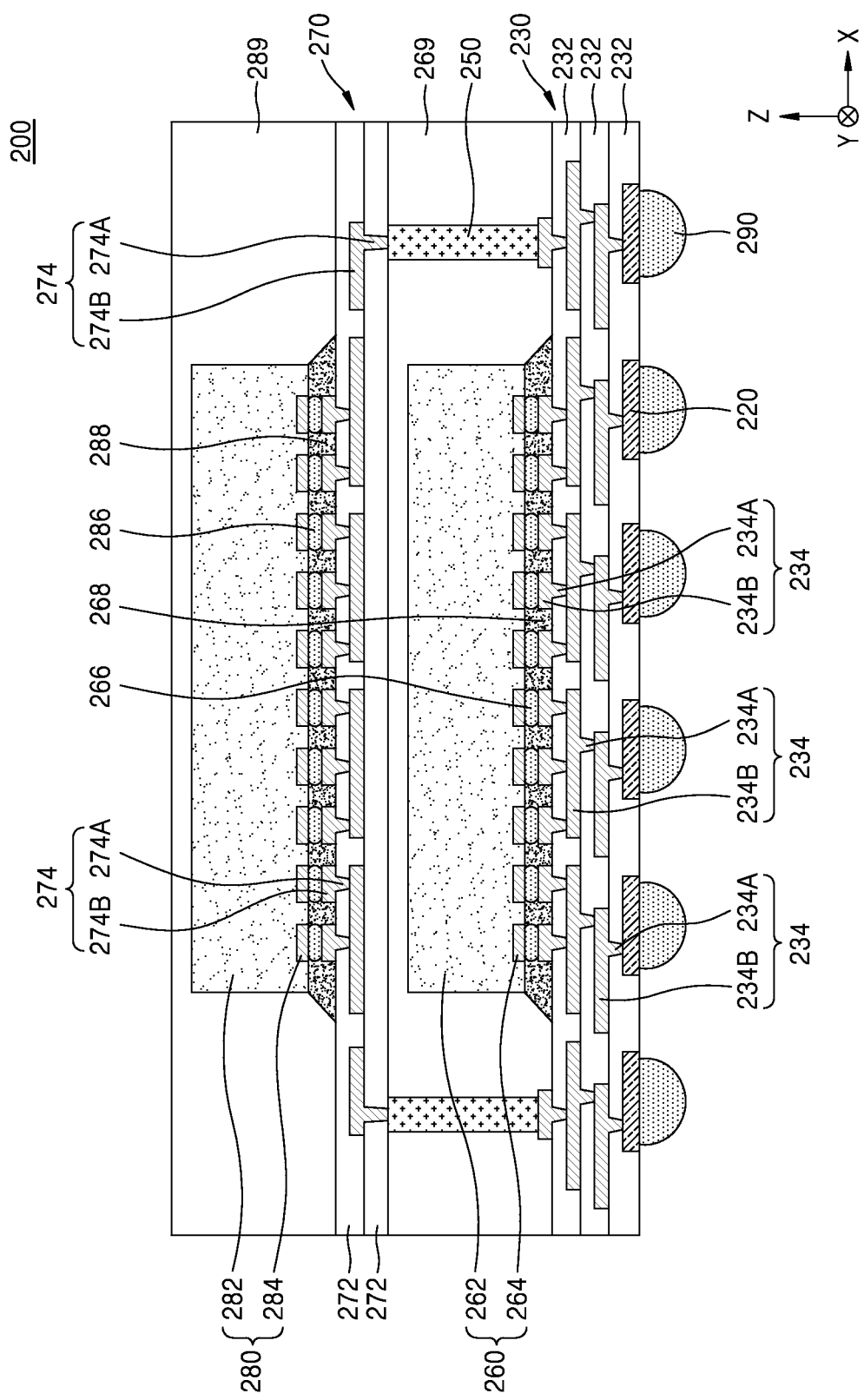

The external electrode pad 220 may function as a under bump metallurgy (UBM) that is connected to an external connection terminal (e.g., an external connection terminal 290 shown in FIG. 2M). The external electrode pads 220 may include, for example, a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or an alloy thereof, without being limited thereto.

In example embodiments, the plurality of external electrode pads 220 may include a single metal material. In other example embodiments, the external electrode pad 220 may have a multilayered structure in which respective layers include different metal materials. To form the plurality of external electrode pads 220, a conductive material film may be formed on the cover layer 214 and patterned.

Referring to FIG. 2C, a lower redistribution structure 230 may be formed on the resultant structure of FIG. 2B.

The lower redistribution structure 230 may include a plurality of insulating films 232 stacked in a vertical direction (Z direction) and a plurality of lower redistribution patterns 234 configured to pass through one of the plurality of insulating films 232. Each of the plurality of lower redistribution patterns 234 may include a conductive via pattern 234A and a plurality of conductive line patterns 234B. Some of the plurality of conductive via patterns 234A may be connected to some of the plurality of conductive line patterns 234B in the vertical direction. Some of the plurality of conductive via patterns 234A may be insulated from some of the plurality of conductive line patterns 234B by the plurality of insulating films 232.

In example embodiments, each of the plurality of insulating films 232 may include, for example, photosensitive polyimide (PSPI), silicon oxide, or silicon nitride.

In example embodiments, the plurality of lower redistribution patterns 234 may include, for example, copper (Cu), titanium (Ti), titanium tungsten (TiW), titanium nitride (TiN), tantalum (Ta), tantalum nitride (TaN), chromium (Cr), aluminum (Al), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or a combination thereof. In example embodiments, the plurality of lower redistribution patterns 234 may be formed using, for example, an electroless plating process, without being limited thereto.

FIG. 2C illustrates a case in which the lower redistribution structure 230 includes three insulating films 232 stacked in the vertical direction (Z direction) and the plurality of lower redistribution patterns 234 having a triple structure, but the inventive concept is not limited thereto. The stacked number of insulating films 232 and the stacked number of lower redistribution patterns 234 may be variously modified according to the design of circuit wirings included in the lower redistribution structure 230.

Referring to FIG. 2D, a photoresist film 240 may be formed on the resultant structure of FIG. 2C and divided into an exposed area 242 and a non-exposed area 244 by irradiating light 248 to a partial area of the photoresist film 240.

In example embodiments, the photoresist film 240 may have a relatively great thickness of several tens of μm to several hundred μm. In some embodiments, the photoresist film 240 may have a thickness of about 50 μm to about 400 μm. In some embodiments, the photoresist film 240 may have a thickness of about 100 μm to about 300 μm.

The photoresist film 240 may include a positive-type photoresist or a negative-type photoresist. In example embodiments, the photoresist film 240 may include a negative-type photoresist.

In example embodiments, the photoresist film 240 may include a (meth)acrylate copolymer, a styrenic copolymer, a base-soluble resin (binder resin) using novolak as a base, a crosslinking agent, and a photo-radical generator. When the photoresist film 240 is exposed to light, the photo-radical generator in the exposed area 242 may generate reactive radicals, thus causing a crosslinking reaction in the exposed area 242. Accordingly, the exposed area 242 may be made insoluble in a developer.

The light 248 may include, for example, i-line (365 nm), 248-nm irradiation, 193-nm irradiation, extreme ultraviolet (EUV) light, or electron beams, without being limited thereto.

Referring to FIG. 2E, the non-exposed area 244 may be removed by developing the photoresist film 240 in the resultant structure of FIG. 2D.

In example embodiments, a developer including, for example, a basic water solution may be used to develop the photoresist film 240. For example, the developer may include a tetramethyl ammonium hydroxide (TMAH) aqueous solution (e.g., about 2.38% TMAH by weight), without being limited thereto.

After the non-exposed area 244 of the photoresist film 240 is removed from the resultant structure of FIG. 2D, the exposed area 242 of the photoresist film 240 may remain as a photoresist pattern 240P. The photoresist pattern 240P may include a plurality of via holes 240H exposing a top surface of the lower redistribution pattern 234.

An aspect ratio of each of the plurality of via holes 240H included in the photoresist pattern 240P may be greater than 1. In example embodiments, an aspect ratio of each of the plurality of via holes 240H may be, for example, in a range of about 3 to about 20, without being limited thereto.

Referring to FIG. 2F, a plurality of conductive posts 250 may be formed inside the plurality of via holes 240H included in the photoresist pattern 240P in the resultant structure of FIG. 2E. Thereafter, a top surface of each of the photoresist pattern 240P and the plurality of conductive post 250 may be planarized.

The conductive post 250 may include, for example, copper (Cu), without being limited thereto. The planarization process may include, for example, an etchback process or an etchback process or a chemical mechanical polishing (CMP) process, without being limited thereto. After the planarization process is performed, a height of the photoresist pattern 240P may be reduced. In example embodiments, the planarization process may be omitted.

Referring to FIG. 2G, to remove the photoresist pattern 240P from the resultant structure of FIG. 2F, a photoresist-removing composition 252 may be applied to the photoresist pattern 240P.

The photoresist-removing composition 252 may be the same as the photoresist-removing compositions described above. A process, such as a dipping process, a spin coating process, a dip coating process, and a spray coating process, may be used to apply the photoresist-removing composition 252 to the photoresist pattern 240P, without being limited thereto.

By applying the photoresist-removing composition 252 to the photoresist pattern 240P as described above with reference to FIG. 2G, the photoresist pattern 240P may be removed according to a process that is similar to that described with reference to processes P120 to P150 of FIG. 1. The resultant structure from which the photoresist pattern 240P is removed may be cleaned using the same method as described with reference to process P160 of FIG. 1.

During the removal of the photoresist pattern 240P by using the photoresist-removing composition 252, the corrosion of a metal-containing structure (e.g., the plurality of conductive posts 250 and the plurality of lower redistribution patterns 234) exposed to the photoresist-removing composition 252 may be reduced or inhibited.

FIG. 2H is a cross-sectional view of an example of the resultant structure from which the photoresist pattern 240P is removed using the photoresist-removing composition 252 in the same manner as described with reference to FIG. 2G.

As shown in FIG. 2H, residue of the photoresist pattern 240P may not remain on the resultant structure from which the photoresist pattern 240P is removed using the photoresist-removing composition 252, and the corrosion of an exposed surface of each of the plurality of conductive posts 250 and the plurality of lower redistribution patterns 234 may not occur or may be reduced or minimized to such an extent that the function of each of the plurality of conductive posts 250 and the plurality of lower redistribution patterns 234 is not adversely affected.

Referring to FIG. 2I, a first semiconductor chip 260 may be adhered to the lower redistribution structure 230.

The first semiconductor chip 260 may include a first semiconductor device 262 and a plurality of chip pads 264 on one surface of the first semiconductor device 262. The first semiconductor chip 260 may be adhered to the lower redistribution structure 230 such that the plurality of chip pads 264 face the lower redistribution structure 230. The plurality of chip pads 264 included in the first semiconductor chip 260 may be connected to the plurality of lower redistribution patterns 234 through a plurality of chip connection terminals 266.

While the first semiconductor chip 260 is being adhered to the lower redistribution structure 230, an underfill material layer 268 may be formed to fill a space between the first semiconductor chip 260 and the lower redistribution structure 230. The underfill material layer 268 may surround the plurality of chip connection terminals 266.

The first semiconductor chip 260 may include a semiconductor substrate. The semiconductor substrate may include, for example, a semiconductor element, such as Si and Ge, or a compound semiconductor, such as SiC, GaAs, InAs, and InP. The first semiconductor chip 260 may have an active surface and an inactive surface opposite to the active surface. In example embodiments, the active surface of the first semiconductor chip 260 may face the lower redistribution structure 230. The first semiconductor chip 260 may include a plurality of individual devices of various types.

The chip connection terminal 266 may include, for example, a pillar structure, a solder bump, a solder ball, a solder layer, or a combination thereof.

The first semiconductor chip 260 may receive at least one of a control signal for an operation of the first semiconductor chip 260, a power signal, and a ground signal from the outside, receive a data signal to be stored in the first semiconductor chip 260 from the outside, or provide data stored in the first semiconductor chip 260 to the outside through the chip connection terminal 266, the lower redistribution structure 230, and the external electrode pad 220.

The In some embodiments, the underfill material layer 268 may include an epoxy resin. In example embodiments, the underfill material layer 268 may include a non-conductive film (NCF).

Referring to FIG. 2J, the lower molding layer 269 molding the first semiconductor chip 260 may be formed in the resultant structure of FIG. 2I.

The lower molding layer 269 may be formed to fill the respective spaces between the first semiconductor chip 260 and the plurality of conductive posts 250. The lower molding layer 269 may include, for example, an epoxy-based material, a thermosetting material, and/or a thermoplastic material. For example, the lower molding layer 269 may include an epoxy molding compound (EMC). After the lower molding layer 269 is formed, a top surface of each of the plurality of conductive posts 250 may be exposed.

Referring to FIG. 2K, an upper redistribution structure 270 may be formed to cover the plurality of conductive posts 250 and the lower molding layer 269 in the resultant structure of FIG. 2J.

The upper redistribution structure 270 may include a plurality of insulating films 272 stacked in the vertical direction (Z direction) and a plurality of upper redistribution patterns 274 formed to pass through one of the plurality of insulating films 272. Each of the plurality of upper redistribution patterns 274 may include a conductive via pattern 274A and a plurality of conductive line patterns 274B. Some of a plurality of conductive via patterns 274A may be connected to some of the plurality of conductive line patterns 274B in the vertical direction. Some of the plurality of conductive via patterns 274A may be insulated from some of the plurality of conductive line patterns 274B by the plurality of insulating films 272.

In example embodiments, the plurality of insulating films 272 may include, for example, photosensitive polyimide (PSPI), silicon oxide, and/or silicon nitride.

In example embodiments, the plurality of upper redistribution patterns 274 may include, for example, copper (Cu), titanium (Ti), titanium tungsten (TiW), titanium nitride (TiN), tantalum (Ta), tantalum nitride (TaN), chromium (Cr), aluminum (Al), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or a combination thereof. In example embodiments, the plurality of upper redistribution patterns 274 may be formed using, for example, an electroless plating process, without being limited thereto.

Referring to FIG. 2L, a second semiconductor chip 280 may be adhered to the upper redistribution structure 270. The second semiconductor chip 280 may include a second semiconductor device 282 and a plurality of chip pads 284 on one surface of the second semiconductor device 282. The second semiconductor chip 280 may be adhered to the upper redistribution structure 270 such that the plurality of chip pads 284 face the upper redistribution structure 270. The plurality of chip pads 284 included in the second semiconductor chip 280 may be connected to the plurality of upper redistribution patterns 274 through a plurality of chip connection terminals 286.

While the second semiconductor chip 280 is being adhered to the upper redistribution structure 270, an underfill material layer 288 may be formed to fill a space between the second semiconductor chip 280 and the upper redistribution structure 270. The underfill material layer 288 may surround the plurality of chip connection terminals 286. Afterwards, an upper molding layer 289 may be formed to mold the second semiconductor chip 280.

Detailed descriptions of the second semiconductor chip 280, the second semiconductor device 282, the plurality of chip pads 284, the plurality of chip connection terminals 286, and the underfill material layer 288 may be substantially the same as those of the first semiconductor chip 260, the first semiconductor device 262, the plurality of chip pads 264, the plurality of chip connection terminals 266, and the underfill material layer 268, which are provided with reference to FIG. 2I.

In example embodiments, the first semiconductor chip 260 and the second semiconductor chip 280 may be elements capable of performing different functions. For example, the first semiconductor chip 260 may include a logic chip, and the second semiconductor chip 280 may include a memory chip. The logic chip may include a microprocessor. For example, the logic chip may be a central processing unit (CPU), a controller, and/or an application specific integrated circuit (ASIC). The memory chip may be, for example, a volatile memory chip, such as a dynamic random access memory (DRAM) or a static RAM (SRAM) chip, or a non-volatile memory chip, such as a phase-change RAM (PRAM) chip, a magneto-resistive RAM (MRAM) chip, a ferroelectric RAM (FeRAM) chip, and a resistive RAM (RRAM). In example embodiments, the memory chip may be a high-bandwidth memory (HBM) DRAM semiconductor chip.

In other example embodiments, the first semiconductor chip 260 and the second semiconductor chip 280 may be elements capable of performing the same function or similar functions. For example, at least one of the first semiconductor chip 260 and the second semiconductor chip 280 may be a System-on Chip (SoC)-type application processor (AP) chip used in a mobile system (e.g., a mobile phone, an MPEG-1 audio layer 3 (MP3) player, a navigation, and a portable media player (PMP)) or a double data rate (DDR) synchronous DRAM (SDRAM) chip (hereinafter, a "DDR chip") used in a mobile system.

Referring to FIG. 2M, the carrier substrate 210 to which the release film 212 is adhered may be separated from the resultant structure of FIG. 2L, and the cover layer 214 may be removed to partially expose the plurality of external electrode pads 220 and the insulating films 232. Afterwards, a plurality of external connection terminals 290 may be adhered to the plurality of external electrode pads 150. The plurality of external connection terminals 290 may be solder balls or bumps.

Thereafter, a singulation process may be performed on the resultant structure of FIG. 2M, and thus, individualized semiconductor packages 200 may be completed.

Next, specific preparation examples of photoresist-removing compositions according to embodiments will be described.

Compositions having various components have been prepared as the photoresist-removing compositions according to the embodiments, and specific preparation examples thereof are shown as Examples 1 to 15 in Table 1. Compositions of Comparative examples 1 to 6 are also shown in Table 1 for comparative evaluation.

TABLE 1

| | Polarity Organic solvent [wt %] | | alkyl ammonium hydroxide [wt %] | | amine [wt %] | | alcohol [wt %] | | Corrosion inhibitor [wt %] | | Water [wt %] |
|---|---|---|---|---|---|---|---|---|---|---|---|
| Example 1 | DMSO | 82 | TMAH | 2 | DETA | 5 | MeOH | 5 | — | — | 6 |
| Example 2 | DMSO | 82 | TMAH | 2 | DETA | 5 | EtOH | 5 | — | — | 6 |
| Example 3 | DMSO | 82 | TMAH | 2 | DETA | 5 | Propanol | 5 | — | — | 6 |
| Example 4 | DMSO | 82 | TMAH | 2 | DETA | 5 | Butanol | 5 | — | — | 6 |
| Example 5 | DMSO | 82 | TMAH | 2 | DETA | 5 | IPA | 5 | — | — | 6 |
| Example 6 | DMSO | 80 | TEAH | 3.5 | DETA | 5 | MeOH | 5 | — | — | 6.5 |
| Example 7 | DMSO | 85 | TBAH | 4 | DETA | 5 | MeOH | 5 | — | — | — |
| Example 8 | DMSO | 82 | TMAH | 2 | TETA | 5 | MeOH | 5 | — | — | 6 |
| Example 9 | DMSO | 82 | TMAH | 2 | TEPA | 5 | MeOH | 5 | — | — | 6 |
| Example 10 | DMSO | 82 | TMAH | 2 | EDA | 5 | MeOH | 5 | — | — | 6 |
| Example 11 | DMSO | 82 | TMAH | 2 | DMBA | 5 | MeOH | 5 | — | — | 6 |
| Example 12 | EGEE | 82 | TMAH | 2 | DETA | 5 | MeOH | 5 | — | — | 6 |
| Example 13 | NMP | 82 | TMAH | 2 | DETA | 5 | MeOH | 5 | — | — | 6 |
| Example 14 | DMI | 82 | TMAH | 2 | DETA | 5 | MeOH | 5 | — | — | 6 |
| Example 15 | DMSO | 81 | TMAH | 2 | DETA | 5 | MeOH | 5 | BTA | 1 | 6 |
| Comparative example 1 | DMSO | 87 | TMAH | 2 | DETA | 5 | — | — | — | — | 6 |

TABLE 1-continued

|  | Polarity Organic solvent [wt %] | | alkyl ammonium hydroxide [wt %] | | amine [wt %] | | alcohol [wt %] | | Corrosion inhibitor [wt %] | | Water [wt %] |
| --- | --- | --- | --- | --- | --- | --- | --- | --- | --- | --- | --- |
| Comparative example 2 | DMSO | 82 | TMAH | 2 | DETA | 5 | EG | 5 | — | — | 6 |
| Comparative example 3 | DMSO | 82 | TMAH | 2 | DETA | 5 | PG | 5 | — | — | 6 |
| Comparative example 4 | DMSO | 82 | TMAH | 2 | DETA | 5 | 1,3-Butandiol | 5 | — | — | 6 |
| Comparative example 5 | DMSO | 82 | TMAH | 2 | DETA | 5 | 1,3-Pentandiol | 5 | — | — | 6 |
| Comparative example 6 | DMSO | 82 | TMAH | 2 | DETA | 5 | Glycerin | 5 | — | — | 6 |

Compounds indicated by abbreviations in Table 1 are as follows.
DMSO: dimethyl sulfoxide
EGEE: ethylene glycol monoethyl ether
NMP: N-methyl-2-pyrrolidone
DMI: 1,3-dimethyl-2-imidazolidinone
TMAH: tetramethylammonium hydroxide
TEAH: tetraethylammonium hydroxide
TBAH: tetrabutylammonium hydroxide
DETA: diethylenetriamine
TETA: triethylenetetramine
TEPA: tetraethylenepentamine
EDA: ethylenediamine
DMBA: dimethylbutylamine
MeOH: methanol
EtOH: ethanol
IPA: isopropyl alcohol
EG: ethylene glycol
PG: propylene glycol
BTA: benzotriazole (benzotriazole)

Evaluation Example 1

Evaluation of Peeling of Negative-Type Photoresist

To evaluate the peeling ability of photoresist-removing compositions according to embodiments, negative-type photoresist (JSR THB-170N) was coated to a thickness of about 200 μm on a wafer including a Cu film formed using a sputtering process, and a photoresist film was exposed to light and cured. Samples for evaluation were prepared by cutting the wafer on which the cured photoresist film was coated into a 2 cm×2 cm size.

The samples for evaluation were immersed for about 10 minutes at a temperature of about 70° C. in respective compositions according to Examples 1 to 15 and Comparative examples 1 to 6, which are shown in Table 1, cleaned with DIW for about 1 minute, and dried with nitrogen. It was confirmed via scanning electron microscope (SEM) whether or not the cured photoresist film was peeled from the obtained resultant structures, and the confirmation results are shown in Table 2.

Evaluation Example 2

Evaluation of Corrosion of Cu Film

To evaluate the corrosion of a Cu film due to photoresist-removing compositions according to embodiments, the Cu film was formed to a thickness of about 3000 Å on a wafer using a sputtering process. Samples for evaluation were prepared by cutting the wafer on which the cured photoresist film was formed into a 2 cm×2 cm size.

The samples for evaluation were immersed for about 30 minutes at a temperature of about 70° C. in the respective compositions according to Examples 1 to 15 and Comparative examples 1 to 6, which are shown in Table 1, cleaned with DIW for about 1 minute, and dried with nitrogen. To evaluate the corrosion of the Cu film from the obtained resultant structures, the average roughness Ra of a surface of the Cu film was measured using an atomic force microscope (AFM), and the measurement results are shown in Table 2.

Evaluation Example 3

Evaluation of Corrosion of SnAg Film

To evaluate the corrosion of a tin-silver (SnAg) film due to a photoresist-removing composition according to embodiments, the SnAg film was formed to a thickness of about 220 μm on a wafer using a plating process. Samples for evaluation were prepared by cutting the wafer on which the SnAg film was formed into a 2 cm×2 cm size.

The samples for evaluation were immersed for about 30 minutes at a temperature of about 70° C. in the respective compositions according to Examples 1 to 15 and Comparative examples 1 to 6, which are shown in Table 1, cleaned with DIW for about 1 minute, and dried with nitrogen. It was confirmed via SEM whether or not the SnAg film corroded from the obtained resultant structures, and the confirmation results are shown in Table 2.

TABLE 2

|  | Peeling of photoresist | Corrosion of Cu film | Corrosion of SnAg film |
| --- | --- | --- | --- |
| Example 1 | ⊚ | ⊚ | ⊚ |
| Example 2 | ⊚ | ◯ | ⊚ |
| Example 3 | ◯ | ◯ | ⊚ |
| Example 4 | ◯ | ◯ | ⊚ |
| Example 5 | ⊚ | ⊚ | ⊚ |

TABLE 2-continued

| | Peeling of photoresist | Corrosion of Cu film | Corrosion of SnAg film |
|---|---|---|---|
| Example 6 | ◎ | ◎ | ◎ |
| Example 7 | ◎ | ◎ | ◎ |
| Example 8 | ◎ | ○ | ◎ |
| Example 9 | ◎ | ○ | ◎ |
| Example 10 | ○ | ○ | ◎ |
| Example 11 | ◎ | ◎ | ◎ |
| Example 12 | ○ | ◎ | ◎ |
| Example 13 | ○ | ◎ | ◎ |
| Example 14 | ◎ | ○ | ◎ |
| Example 15 | ○ | ◎ | ◎ |
| Comparative example 1 | Δ | Δ | ◎ |
| Comparative example 2 | X | ○ | ◎ |
| Comparative example 3 | X | ○ | ◎ |
| Comparative example 4 | X | ○ | ◎ |
| Comparative example 5 | X | ○ | ◎ |
| Comparative example 6 | X | ○ | ◎ |

In Table 2, the meaning of each symbol indicated as the peeling evaluation result of photoresist is as follows.

◎: 100% removal.
○: 90% or more and less than 100% removal.
Δ: Occurrence of lift-off.
X: Less than 70% removal.

In Table 2, the meaning of each symbol indicated as the corrosion evaluation result of the Cu film is as follows.

◎: Not observed (Ra=1.40).
○: Slightly observed (Ra=1.50).
Δ: Partially observed (Ra=1.69).
X: Entirely observed (Ra=3.2).

In Table 2, the meaning of each symbol indicated as the corrosion evaluation result of the SnAg film is as follows.

◎: Not observed.
○: Slightly observed.
Δ: Partially observed.
X: Entirely observed.

As can be seen from the evaluation results of Table 2, the photoresist-removing compositions according to example embodiments of the inventive concept may not cause lift-off of the photoresist film to be removed but effectively remove the negative-type photoresist film without corrosion of the Cu film and the SnAg film. In contrast, the composition according to Comparative example 1 did not include a monovalent alcohol. When a photoresist film was peeled using the composition according to Comparative example 1, the photoresist film was lifted off. Each of the compositions according to Comparative examples 2 to 6 included a dihydric alcohol or a trihydric alcohol instead of a monovalent alcohol. When a photoresist film was peeled by using the compositions according to Comparative examples 2 to 6, the peeling performance of the photoresist film was degraded.

According to the photoresist-removing composition according to the embodiments, a photoresist film formed to a relatively large thickness of several tens of μm to several hundred μm may be cleanly removed or may be substantially removed (greater than 90% of the photoresist removed but less than 100% removed). Even when a negative-type photoresist film cured due to a crosslinking reaction has a relatively large thickness of several hundred μm, a negative-type photoresist pattern may be cleanly removed or substantially removed by being dissolved without causing a lift-off phenomenon. In addition, when the photoresist-removing composition according to the embodiments is used in the semiconductor package manufacturing process, a metal-containing structure exposed to the photoresist-removing composition along with a photoresist pattern may not corrode. Accordingly, even a negative-type photoresist pattern in a cross-linked state, which is difficult to remove by typical methods, may be cleanly removed without leaving residue, or with minimal residue, and without damaging a metal-containing structure exposed to the photoresist-removing composition. Therefore, the productivity in a semiconductor package manufacturing process using a photoresist-removing composition according to embodiments may be improved.

According to methods according to example embodiments of the inventive concept, 90% or more but less than 100% of a photoresist may be removed by the photoresist-removing compositions according to example embodiments of the inventive concept.

While the inventive concept has been particularly shown and described with reference to embodiments thereof, it will be understood that various changes in form and details may be made therein without departing from the scope of the inventive concept.

What is claimed is:

1. A photoresist-removing composition comprising:
   a polar organic solvent;
   an alkyl ammonium hydroxide;
   an aliphatic amine not comprising a hydroxy group; and
   a monovalent alcohol in an amount of about 1% to about 15% by weight of the photoresist-removing composition.

2. The photoresist-removing composition of claim 1, wherein the photoresist-removing composition comprises the polar organic solvent in an amount of about 65% to about 90% by weight of the photoresist-removing composition, the alkyl ammonium hydroxide in an amount of about 1% to about 10% by weight of the photoresist-removing composition, and the aliphatic amine in an amount of about 1% to about 10% by weight of the photoresist-removing composition.

3. The photoresist-removing composition of claim 1, further comprising water.

4. The photoresist-removing composition of claim 1, further comprising a corrosion inhibitor comprising an azole-based compound, a polyhydric alcohol compound, and/or hydroxylamine,
   wherein the photoresist-removing composition comprises the corrosion inhibitor in an amount of about 0.001% to about 1% by weight of the photoresist-removing composition.

5. The photoresist-removing composition of claim 1, wherein the aliphatic amine comprises at least three amino groups.

6. The photoresist-removing composition of claim 1, wherein the aliphatic amine comprises diethylenetriamine (DETA), triethylenetetramine (TETA), tetraethylenepentamine (TEPA), or a combination thereof.

7. The photoresist-removing composition of claim 1, wherein the polar organic solvent comprises a sulfoxide solvent, a glycol ether solvent, a sulfone solvent, sulfolane, a lactam solvent, a lactone solvent, an imidazolidinone solvent, an amide solvent, or a combination thereof.

8. The photoresist-removing composition of claim 1, wherein the polar organic solvent comprises dimethyl sulfoxide, ethylene glycol monoethyl ether, N-methyl-2-pyrrolidone, 1,3-dimethyl-2-imidazolidinone, or a combination thereof, and the photoresist-removing composition comprises the polar organic solvent in an amount of about 65% to about 90% by weight of the photoresist-removing composition.

9. The photoresist-removing composition of claim 1, wherein the alkyl ammonium hydroxide comprises a tetraalkylammonium hydroxide comprising a C1-C4 alkyl group.

10. The photoresist-removing composition of claim 1, wherein the monovalent alcohol comprises methanol, ethanol, propanol, butanol, isopropyl alcohol, isobutanol, or a combination thereof.

11. A photoresist-removing composition comprising:
a polar organic solvent;
an alkyl ammonium hydroxide;
an aliphatic amine not comprising a hydroxy group;
a monovalent alcohol in an amount of about 1% to about 15% by weight of the photoresist-removing composition; and
a corrosion inhibitor comprising an azole-based compound and/or hydroxylamine.

12. The photoresist-removing composition of claim 11, wherein the photoresist-removing composition comprises the corrosion inhibitor in an amount of about 0.001% to about 1% by weight of the photoresist-removing composition.

13. The photoresist-removing composition of claim 11, wherein the photoresist-removing composition comprises the polar organic solvent in an amount of about 65% to about 90% by weight of the photoresist-removing composition, the alkyl ammonium hydroxide in an amount of about 1% to about 10% by weight of the photoresist-removing composition, and the aliphatic amine in an amount of about 1% to about 10% by weight of the photoresist-removing composition.

14. The photoresist-removing composition of claim 11, further comprising water.

15. The photoresist-removing composition of claim 11, wherein the aliphatic amine comprises at least three amino groups.

16. The photoresist-removing composition of claim 11, wherein the aliphatic amine comprises diethylenetriamine (DETA), triethylenetetramine (TETA), tetraethylenepentamine (TEPA), or a combination thereof.

17. The photoresist-removing composition of claim 11, wherein the polar organic solvent comprises a sulfoxide solvent, a glycol ether solvent, a sulfone solvent, sulfolane, a lactam solvent, a lactone solvent, an imidazolidinone solvent, an amide solvent, or a combination thereof.

18. The photoresist-removing composition of claim 11, wherein the polar organic solvent comprises dimethyl sulfoxide, ethylene glycol monoethyl ether, N-methyl-2-pyrrolidone, 1,3-dimethyl-2-imidazolidinone, or a combination thereof, and the photoresist-removing composition comprises the polar organic solvent in an amount of about 65% to about 90% by weight of the photoresist-removing composition.

19. The photoresist-removing composition of claim 11, wherein the alkyl ammonium hydroxide comprises a tetraalkylammonium hydroxide comprising a C1-C4 alkyl group.

20. The photoresist-removing composition of claim 11, wherein the monovalent alcohol comprises methanol, ethanol, propanol, butanol, isopropyl alcohol, isobutanol, or a combination thereof.

* * * * *